United States Patent
Van Buren et al.

(10) Patent No.: US 8,874,030 B2
(45) Date of Patent: Oct. 28, 2014

(54) OSCILLATION DETECTION AND OSCILLATION MITIGATION IN AMPLIFIERS

(75) Inventors: Vernon A. Van Buren, Cedar City, UT (US); Patrick L. Cook, St. George, UT (US); Christopher K. Ashworth, St. George, UT (US); Richard M. Kline, Cedar City, UT (US)

(73) Assignee: Wilson Electronics, LLC, St. George, UT (US)

(*) Notice: Subject to any disclaimer, the term of this patent is extended or adjusted under 35 U.S.C. 154(b) by 0 days.

(21) Appl. No.: 13/439,148

(22) Filed: Apr. 4, 2012

(65) Prior Publication Data

US 2013/0053020 A1    Feb. 28, 2013

Related U.S. Application Data

(60) Provisional application No. 61/526,452, filed on Aug. 23, 2011.

(51) Int. Cl.
*H04B 7/14* (2006.01)
*H03G 3/30* (2006.01)

(52) U.S. Cl.
CPC .................. *H03G 3/3036* (2013.01)
USPC .......... 455/15; 455/115.1; 455/127.1

(58) Field of Classification Search
USPC .......... 455/7, 11.1, 12.1, 422.1, 91, 102, 103, 455/115.1–115.3, 126.1, 127.1–127.4, 15
See application file for complete search history.

(56) References Cited

U.S. PATENT DOCUMENTS

| | | | |
|---|---|---|---|
| 4,539,527 A | 9/1985 | Ishigaki et al. | |
| 4,595,803 A | 6/1986 | Wright | |
| 4,731,869 A * | 3/1988 | Farrer | 455/127.1 |
| 5,095,528 A | 3/1992 | Leslie et al. | |
| 5,787,336 A * | 7/1998 | Hirschfield et al. | 455/127.1 |
| 5,815,795 A | 9/1998 | Iwai | |
| 6,384,681 B1 | 5/2002 | Bonds | |
| 6,584,081 B1 | 6/2003 | Lee et al. | |
| 6,892,080 B2 | 5/2005 | Friesen et al. | |
| 7,184,703 B1 | 2/2007 | Naden et al. | |
| 7,233,771 B2 | 6/2007 | Proctor, Jr. et al. | |
| 7,245,880 B1 | 7/2007 | Jacobsen | |
| 7,409,186 B2 | 8/2008 | Van Buren et al. | |
| 7,620,380 B2 | 11/2009 | Hendrix et al. | |
| 1,359,207 A1 | 8/2012 | Van Buren et al. | |
| 1,359,324 A1 | 8/2012 | Van Buren et al. | |
| 2002/0101936 A1 | 8/2002 | Wright et al. | |
| 2003/0123401 A1 | 7/2003 | Dean | |
| 2003/0124997 A1 | 7/2003 | Park | |
| 2003/0211828 A1 | 11/2003 | Dalgleish et al. | |
| 2004/0146013 A1 | 7/2004 | Song et al. | |
| 2004/0229586 A1 | 11/2004 | Oshima et al. | |

(Continued)

OTHER PUBLICATIONS

International Search Report & Written Opinion dated Nov. 6, 2012 as received in application No. PCT/US2012/052144.

(Continued)

*Primary Examiner* — Thanh Le
(74) *Attorney, Agent, or Firm* — Maschoff Brennan

(57) ABSTRACT

An amplifier configured to handle oscillation is disclosed. The amplifier monitors a signal ratio to determine when the amplifier is oscillating. The gain is reduced when oscillation is detected and the amplifier is allowed to operate normally when oscillation is not detected.

24 Claims, 4 Drawing Sheets

(56) References Cited

U.S. PATENT DOCUMENTS

| | | |
|---|---|---|
| 2005/0272367 A1 | 12/2005 | Rodgers et al. |
| 2006/0091950 A1 | 5/2006 | Hayase |
| 2006/0209997 A1 | 9/2006 | Van Buren et al. |
| 2007/0071128 A1 | 3/2007 | Meir et al. |
| 2007/0178928 A1* | 8/2007 | Ode ............................ 455/522 |
| 2007/0197207 A1 | 8/2007 | Carstens et al. |
| 2008/0014862 A1* | 1/2008 | Van Buren et al. ............. 455/7 |
| 2008/0076437 A1 | 3/2008 | Wilson et al. |
| 2008/0212500 A1 | 9/2008 | Zhen et al. |
| 2008/0293370 A1 | 11/2008 | Wood |
| 2008/0304434 A1* | 12/2008 | Giaretta et al. ............. 455/517 |
| 2009/0311985 A1 | 12/2009 | Youssoufian et al. |
| 2010/0009646 A1 | 1/2010 | Mevel et al. |
| 2010/0093388 A1 | 4/2010 | Bagchi |
| 2010/0159856 A1 | 6/2010 | Kato et al. |
| 2010/0248751 A1 | 9/2010 | Tsutsui |
| 2010/0321219 A1* | 12/2010 | Li ................................ 341/139 |
| 2011/0105060 A1 | 5/2011 | Kim et al. |
| 2011/0190028 A1 | 8/2011 | Hahn et al. |
| 2011/0217943 A1 | 9/2011 | Ashworth et al. |

OTHER PUBLICATIONS

International Search Report & Written Opinion dated Nov. 2, 2012 as received in application No. PCT/US2012/052155.

U.S. Appl. No. 11/457,406, Feb. 21, 2008, Office Action.

U.S. Appl. No. 11/457,406, May 23, 2008, Notice of Allowance.

U.S. Appl. No. 13/040,125, Jun. 8, 2012, Office Action.

\* cited by examiner

OSCILLATION DETECTION AND OSCILLATION MITIGATION IN AMPLIFIERS

CROSS REFERENCE TO RELATED APPLICATIONS

This application claims the benefit of U.S. Provisional Application No. 61/526,452 filed on Aug. 23, 2011. The foregoing application is incorporated by reference in its entirety.

BACKGROUND

Booster amplifiers are bi-directional amplifiers used for increasing the sensitivity and power output of cell phones and other devices that are communicating through them. The use of a booster amplifier, however, may disrupt cellular systems of both the network through which the device is communicating and other cellular networks that the device is not communicating through.

The potentially adverse effects of a booster amplifier can result in situations where other devices are dropped or disconnected or in situations that interfere with the operation of base stations in a wireless network. A booster amplifier, for example, may begin to self-oscillate. This condition often results in noise that can cause interference in the cellular system. With the introduction of newer cellular and wireless technologies, there is a need to prevent devices operating in the various networks from interfering in the networks. At the same time, there is a need to enhance the ability of a device to effectively communicate in their respective networks.

SUMMARY

Embodiments of the invention relate to systems and methods for detecting and/or mitigating oscillation in an amplifier operating in a wireless network. By detecting a status of an amplifier (e.g., oscillating, normal), the gain can be controlled in a manner that permits the amplifier to effectively amplify useful signals while reducing the adverse effects on the wireless network when the amplifier is oscillating.

In one example, the amplifier includes an amplifier chain that receives a signal for amplification. The signal may be preamplified. A preamplifier used to preamplify the signal may include a filter such that only certain bands of signals are passed to the amplifier chain. A signal detector then samples the signal as the signal is amplified in the amplifier chain. The signal detector can sample the signal at any point in the amplifier chain (including at an output of the preamplifier). The samples are analyzed to determine a signal ratio signal ratio and a controller determines a status of the amplifier. The signal ratio may include a peak to average power ratio, a peak to peak power ratio, a change in sample power levels, voltage ratios, current ratios, or the like or any combination thereof.

When, in some embodiments, the signal ratio is below a predetermined threshold, the status is oscillation and when the signal ratio is above the predetermined threshold, the status is normal. A switching circuit can or other appropriate circuitry can be used to control the gain according to the status. The gain is changed (e.g., reduced) or shut off when the status is oscillation.

A method for handling oscillation includes sampling a signal amplified in the amplifier a plurality of times to obtain a plurality of samples. A signal ratio is determined from the samples. Finally, a status of the amplifier is determined based on the signal ratio. A gain of the amplifier is changed when the status is oscillation.

These and other advantages and features of the present invention will become more fully apparent from the following description and appended claims, or may be learned by the practice of the invention as set forth hereinafter.

BRIEF DESCRIPTION OF THE DRAWINGS

To further clarify at least some of the advantages and features of the present invention, a more particular description of the invention will be rendered by reference to specific embodiments thereof which are illustrated in the appended drawings. It is appreciated that these drawings depict only illustrated embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Figure 1:
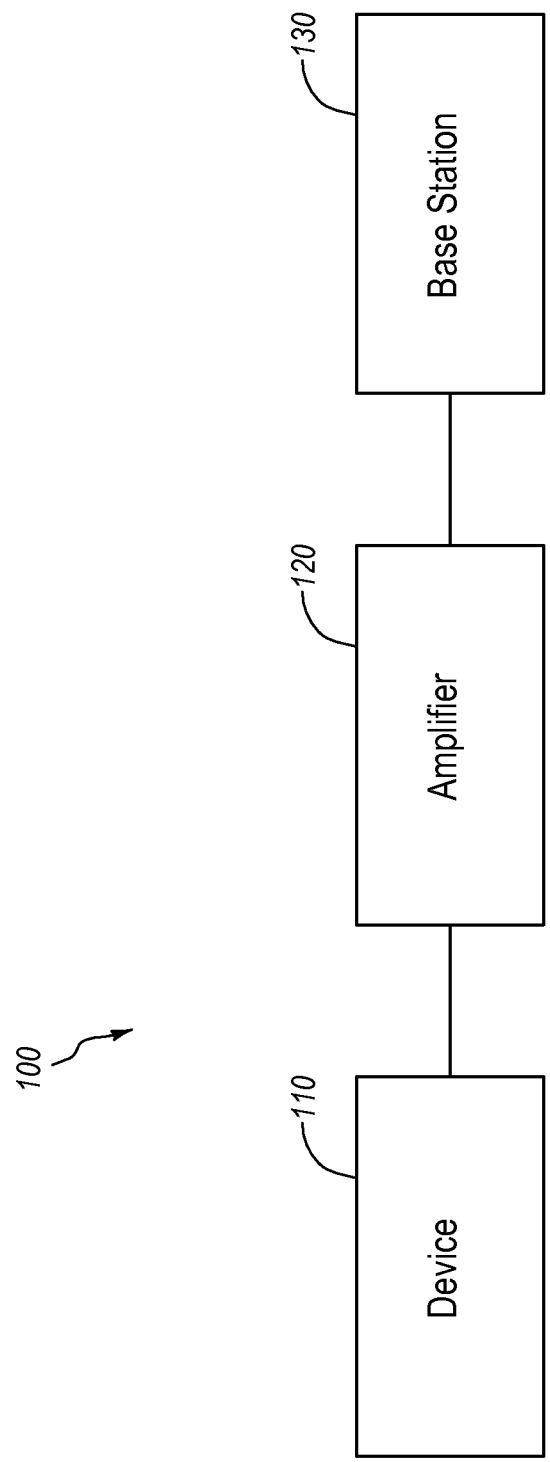
FIG. 1 illustrates an example of an amplifier operating in a communication system.

Embodiments of the invention relate generally to systems and methods for detecting oscillation in an amplifier. Embodiments further relate to amplifiers that are used in the context of wireless communication, including cellular communication. Amplifiers may be used, for example, to amplify communications between a wireless device such as a cellular phone and a base station. The amplifier may be configured to amplify uplink and downlink signals.

Embodiments of the invention can detect self-oscillation in an amplifier, as well as distinguish between self-oscillation and actual use of the amplifier, for example during communication in a wireless network. In other words, embodiments of the invention detect whether or not an amplifier is actually being used to amplify useful or desirable signals. When embodiments detect that no useful or desirable signals are present or when the amplifier is oscillating, the amplifier is turned off or the gain of the amplifier is reduced so that the amplifier does not interfere with other users of the radio spectrum (e.g. cellular base stations).

A properly functioning amplifier (also referred to herein as a booster amplifier) should be transparent to the cellular system such that base stations do not perceive any significant differences for either the case of a device (e.g., a cell phone) communicating by itself, or a device communicating through the amplifier. Additionally, any emissions from the amplifier should always be within limits acceptable to cellular systems, even when a device is not communicating through the amplifier. As a result, embodiments can distinguish between self-oscillation and signal amplification such that the amplifier can be advantageously used in a wireless network while minimizing any adverse effects on the wireless network that may be caused by the amplifier.

Embodiments of the invention may be discussed with reference to a cell phone operating in a cellular network, although embodiments are applicable to other networks including other radio frequency (RF) networks and/or other devices operating in these networks.

One of skill in the art, with the benefit of the present disclosure, can appreciate that embodiments of the invention can be used with or included/integrated in other devices operating in a wireless network. Exemplary devices include, by way of example only, cell phones, personal digital assistants, smart phones, laptop computers, modems, or other network enabled devices. Wireless networks include cellular networks as well as other wireless networks.

"Cell site" and "base station" are used herein interchangeably. Cell site and base station refer to the systems and/or locations where the wireless network antenna and communications equipment is placed. The wireless network typically has many base stations in operation. A base station typically includes a transmitter/receiver, antenna tower, and radio controllers for maintaining communications with wireless devices within a given range or area.

Embodiments of the amplifier, for example, may amplify signals for one or more devices (e.g., cell phones) in communication with one or more base stations. Embodiments of the invention relate to amplifiers, including booster amplifiers, that enhance the ability of a device such as a cellular telephone (or other device configured to communicate over a wireless network) to communicate in a wireless network.

Embodiments extend to systems and methods for adjusting the gain, dynamically in some embodiments, that is applied to a wireless signal such as a cellular signal. Embodiments of the invention also detect and eliminate amplifier oscillation, for example when the amplifier is not amplifying useful or desirable signals.

FIG. 1 generally illustrates a system 100 that enables wireless communication. The system 100 may be configured to allow wireless communication in one or more spectrums. Some portions of the system 100 may include wired connections as well. In addition, the system 100 (or components thereof) may interface and communicate with other systems, such as the Internet.

FIG. 1 illustrates a device 110 that communicates with a base station 130 using an amplifier 120 in the system 100. The base station 130 is typically one of many base stations that may be present in a wireless system. Similarly, the device 110 may be one of many devices that are communicating with the base station 130 or with other base stations in the wireless cellular system. The device 110 may be a cell phone, smart phone, handset, computer, tablet, or other wireless (or wired) device.

The amplifier 120 typically amplifies signals received from the base station 130 as well as signals transmitted to the base station 130. The amplification for these signals may be the same or different. In other words, an amplification factor applied to uplink signals may be different from an amplification factor applied to downlink signals.

The amplifier 120 typically communicates wirelessly with the base station 130. The communication between the device 110 and the amplifier 120 can be via a wireless connection or a wired connection. The amplifier 120 may include one or more antennas that enable communication between the device 110 and the base station 130.

During operation, the amplifier 120 can dynamically amplify signals transmitted to the base station 130 as well as signals received from the base station 130. The gain applied to the signals being amplified can be dynamically adjusted over time and in accordance with various factors. For example, the gain may be set to account for or to mitigate potential issues that may arise in the wireless environment. The amplifier 120 may be configured to prevent the amplifier itself from interfering with the operation of the system 100 and/or of the base station 130 and/or of other devices operating in the system 100 or with other wireless systems that may be in operation.

For example, embodiments of the invention consider parameters that may have an impact on the operation of the amplifier 120 when setting the amplifier's gain. In one embodiment, the operation of the amplifier 120 is monitored to ensure that the amplifier 120 does not oscillate. If oscillation is detected in the amplifier 120, then the gain of the amplifier 120 is reduced or the amplifier 120 is turned off in order to eliminate the oscillation and reduce the adverse effects of the oscillation.

Because it may be possible to confuse oscillation with valid amplification, embodiments of the invention also distinguish between oscillation and valid amplification, at least some embodiments of the invention are configured to evaluate the signal being amplified to distinguish between valid amplification and oscillation prior to reducing the gain or shutting off the amplifier. By way of example only, a desirable signal may be present when the device 110 is used to communicate in the system 100 or transmit/receive signals (e.g., a cellular phone call, Internet access, etc., are examples of when a desirable signal is present). When the device 110 is idle or not being used, a desirable signal may not be present at the input to the amplifier 120. It may also be possible for oscillation to occur when amplifying a valid signal. Embodiments of the invention may also change the gain in a manner that eliminates the oscillation even when amplifying valid signals.

The amplifier includes circuitry, modules, controllers, processors and/or components (e.g., hardware, software, firmware, etc.) that determine an optimum gain or optimum configuration (including off) under various circumstances including oscillation. The amplifier 120 can be configured, for example, to reduce, change, or eliminate the gain applied by the amplifier 120 when oscillation is detected.

Figure 2:
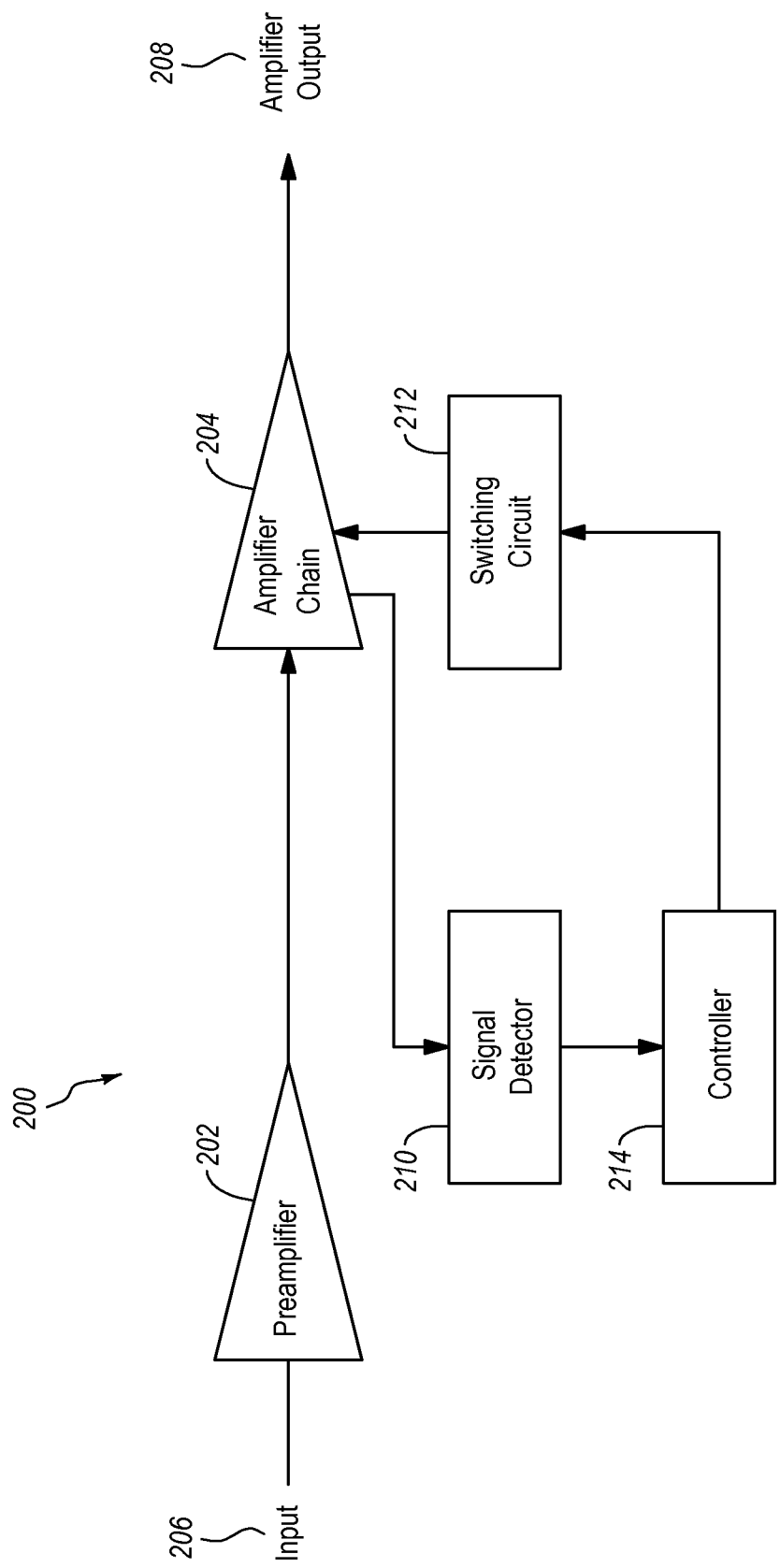
FIG. 2 illustrates an embodiment of an amplifier configured to detect and ameliorate oscillation in the amplifier.

FIG. 2 generally illustrates an embodiment of an amplifier 200, which is an example of the amplifier 120. The amplifier 200 may include one or more stages and may be configured to amplify signals transmitted to the base station as well as signals received from the base station. When embodiments of the invention operate in the uplink path and the downlink path, the circuitry can be adapted to account for the signal path. For example, one amplifier (or chain of amplifiers) may amplify in the uplink direction while another amplifier (or chain of amplifiers) may be used to amplify in the other direction. Some components can be shared, such as a controller or a microcontroller, which has the ability to control amplification in either direction. Suitable hardware may be provided in order to route these signals as necessary within the amplifier 200.

In this example, an input 206 is provided to a preamplifier 202. An output of the preamplifier 202 usually includes amplified input signals (examples of desired signals) and amplified thermal noise such as amplified broadband thermal noise. By way of example only, in the 800 MHz Cellular band, the uplink bandwidth would be at least from 824 to 849 MHz, and in the 1900 MHz PCS band, the uplink bandwidth would be at least from 1850 to 1910 MHz.

The output of the preamplifier 202 is provided to the amplifier chain 204. The signal detector 210 detects or samples an output of the amplifier chain 204 in one embodiment. Alternatively, the signal detector 210 can sample the signal at any point in the amplification chain including before and/or after the signal is operated on or amplified by the amplifier chain 204. In this example, the signal detector 210 may sample the output of the amplifier chain 204, although the signal detector 210 may also sample the signals received and/or transmitted by the amplifier 200 at other locations or at other times as previously stated. In addition, the signal detector 210 may be configured to operate with specific frequencies (e.g., the cellular band). Further, the preamplifier 202 may include a filter that restricts or controls which frequencies or bands are passed to the amplifier chain 204.

During oscillation detection, the signal detector 210 may sample the output of the amplifier chain 204 a multitude of times over a predetermined time period. By way of example, the output may be sampled about 100 times over a short period of time such as 3 milliseconds. One of skill in the art, with the benefit of the present disclosure, can appreciate that the different numbers of samples can vary and can be taken over different periods. For example, approximately 100 samples can be taken over 5 milliseconds. The number of samples and the time over which the samples are taken can vary. In addition, the samples can be taken continuously or at predetermined intervals. In one embodiment, samples are taken continuously and a time window can be applied to the samples for evaluating the samples. A 3 millisecond window, by way of example, can be applied to the samples taken by the signal detector 210. By continuously taking and evaluating samples, the status (e.g., oscillating or not oscillating) of the amplifier 200 can be repeatedly evaluated.

The samples taken by the signal detector 210 may be provided to the controller 214. The controller 214 can then evaluate the samples to determine the status of the amplifier 200.

Figure 3:
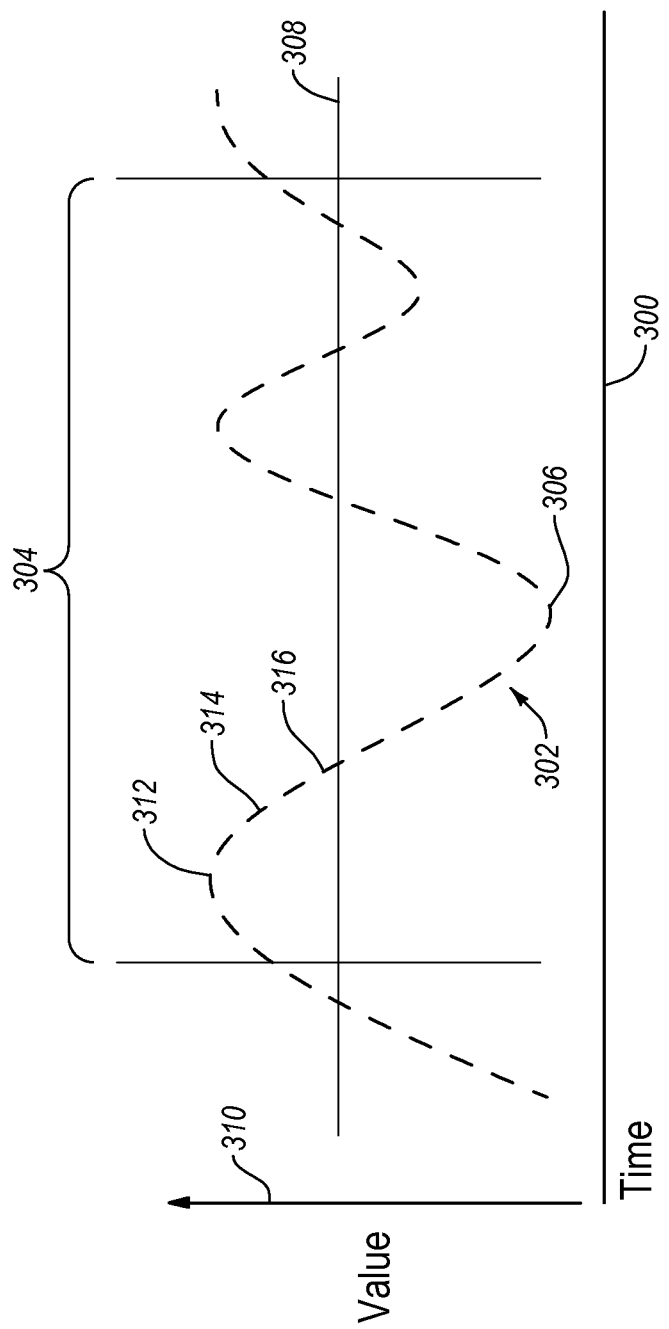
FIG. 3 illustrates examples of samples taken by a signal detector included in the amplifier and used in determining whether the amplifier is oscillating.

FIG. 3 illustrates an example of samples taken by the signal detector 210. FIG. 3 illustrates samples 302 of a signal that is being amplified over time 300 in one embodiment. In FIG. 3 one axis represents time and another axis represents value 310. The value 310 may correspond to a number of values associated with signals. The value may correspond to power, voltage, current, amplitude, phase, or the like or any combination thereof. The value of the samples 302 may be stored in a memory. For discussion, the value of the samples is often referred to herein in terms of power, but can be other values as previously discussed.

A window 304 is then applied to the samples. The window 304 may correspond to a particular time period or can be dynamically adjusted. By way of example and not limitation, the window may be 3 ms or 5 ms wide. Other periods are also within the scope of the invention. The window 304 can also be shifted relative to time 300 such that different samples may be considered when evaluating any signal ratios. In some embodiments, the samples obtained by the signal detector may be in terms of voltage or current and may be converted to another value such as power.

The following discussion discusses the samples in terms of power and some of the signal ratios are discussed in terms of power ratios (e.g., a peak to average power ratio, a peak to peak power ratio, or a change in sample power levels). As previously stated, however, embodiments of the invention are not limited to power ratios and can be implemented using other signal ratios that may include voltage ratios, current ratios, voltage to current ratios, or the like or any combination thereof. Thus, the values 310 in FIG. 3 can be representative of multiple signal values.

In one example, within the window 304, a peak power 306 may be determined or identified from the samples 302 within the window 304. An average power 308 may also be determined from the samples 302 within the 304 window. A ratio of the peak power to the average power—a peak to average power ratio (PAPR—which is an example of a signal ratio) can then be determined.

A peak to peak power ratio could be determined from the peak power 306 and a peak power 312. In one embodiment, the peak to peak ratio may represent the highest point of the waveform to the lowest point of the waveform—or from the highest or largest sample to the lowest sample. Although FIG. 3 illustrates only a few peaks for convenience, the window 304 may include a larger number of peaks such that the peak to peak power can be evaluated using multiple peaks. In determining the peak to peak power ratio, the ratio may determined from samples that may include adjacent peaks, multiple pairs of adjacent peaks, an average determined from multiple pairs of adjacent peaks, non-adjacent peaks, or the like or any combination thereof.

A change in sample power levels may be determined from the samples 314 and 316. The signal ratio in this example may include an analysis of multiple pairs of adjacent samples and the change in power levels from the multiple pairs of samples can be averaged.

In each of the foregoing examples, and as discussed in more detail below, oscillation may be determined when the signal ratios are less than a predetermined value. One of skill in the art can appreciate that the predetermined value can be selected such that oscillation can be determined with the signal ratio is less than, greater than, equal to or greater than, equal to or less than, or the like, than the predetermined value.

However, the predetermined value for the peak to average power ratio may differ from the predetermined values for other signal ratios. Further, the determination of whether the amplifier is oscillating can be made by considering more than one signal ratio. Any combination, by way of example only, of the peak to average power ratio, the peak to peak power ratio, and the change in sample power levels can be used to determine the status of the amplifier.

The following example is provided for the peak to average power ratio (PAPR). A similar approach can be followed for other signal ratios.

In one example, the samples may be stored in a memory and the window 304 (and/or windows of other time periods) can then be applied to different samples that have been taken by the signal detector. The resulting PAPR (or other signal ratios) can also be stored for each window.

In many wireless networks (e.g., CDMA, GSM, LTE, WiMAX), there is a PAPR of 5 to 10 dB in some examples. Oscillation, in contrast, in the amplifier 200 has a substantially lower peak to average power ratio value because oscillation saturates the amplifier and compresses the signal. In this case, a difference between the peak and average measurement may be closer to 0 dB, which indicates a carrier or oscillation.

Thus, with reference back to FIG. 2, the controller 214 can determine the PAPR and determine whether the amplifier 200 is oscillating. In one example, if the PAPR exceeds a threshold level or a predetermined value, then the controller 214 determines that the amplifier 200 is not oscillating and that the status is normal. If the PAPR is below the threshold value, then the amplifier 200 may be oscillating. In some examples, additional determinations may be performed to verify the oscillation status before the gain is actually reduced. This may be performed in order to prevent any use of the device from being interrupted. In other words, the gain may be reduced first when a desirable signal is being amplified and oscillation is detected.

In one example, determining that the amplifier 200 is oscillating can be based on multiple PAPR measurements (and/or other signal ratio measurements) that are based on one or more windows. This can enhance the ability of the controller 214 to more accurately identify when the amplifier is oscillating. The PAPR for one window may be different than the PAPR of another window. In addition, the resulting PAPR measurements for the corresponding windows may be averaged in a suitable manner before oscillation is determined to be present in the amplifier.

When oscillation is detected, the gain is reduced or the amplifier 200 is turned off using, in one example, a switching circuit 212. The controller 214 communicates with the switching circuit 212 (which may include or be included in a variable gain control module) to control the gain of the amplifier 200 as necessary to eliminate the oscillation. The gain can be gradually reduced, reduced in steps, or the like. If oscillation is not present, normal operation may allow other modules to dynamically adjust the gain. In one embodiment, the ability of other modules to dynamically adjust the gain of the amplifier chain 204 may be restricted or reduced when the output of the switching circuit 212 indicates that the amplifier chain 204 is off or has reduced gain. The switching circuit 212, in other words, may have control that supersedes other components or modules of the amplifier 200.

As discussed herein, embodiments of the invention can reduce the effect of oscillation on a wireless system. The amplifier is controlled by determining whether oscillation is present. When the amplifier is being used to amplify a desirable signal, the amplifier is enabled to operate normally. If oscillation is detected even when amplifying a desirable signal, the gain may be reduced as discussed herein.

The gain of the amplifier can be achieved gradually, for example when oscillation is detected, by a variable attenuator or by changing a bias voltage to the amplifier (e.g., to an amplifier in the amplifier chain).

Figure 4:
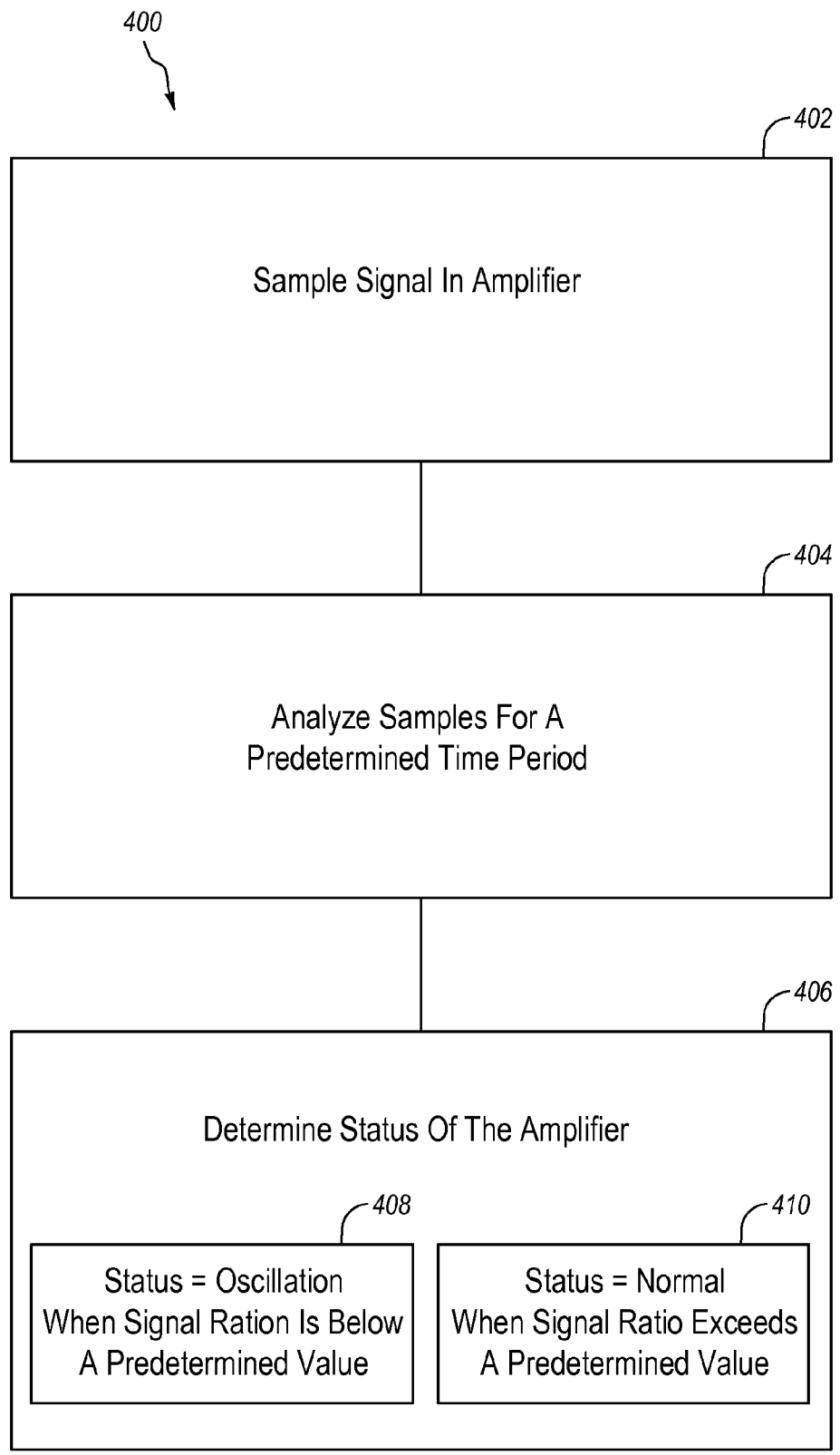
FIG. 4 illustrates an example method for handling oscillation in an amplifier.

FIG. 4 illustrates an exemplary method for handling oscillation in an amplifier. A method 400 for reducing amplifier noise may begin by sampling 402 a signal being amplified in an amplifier. The sampling may be continuous in one example or may occur periodically. The samples can be taken at any point (including the input and/or the output) in the amplifier chain.

The method then analyzes 404 the samples over a predetermined time period. This can be done by applying a time window to the samples, which may be stored in memory. The samples can be stored, for example, in a rotating buffer. The samples are analyzed to determine at least one signal ratio. The samples in a given window may be used to determine one or more signal ratios including, by way of example only, a PAPR, a peak to peak power ratio, or a change in sample power levels.

The method then determines 406 a status of the amplifier. The status may be determined using one or more of the signal ratios. Of course, the status can be determined using only one of the signal ratios and there is no requirement that more than one signal ratio be used to determine the status of the amplifier.

If the signal ratio exceeds a threshold or predetermined value, the controller determines 410 that oscillation is not occurring in the amplifier. The status is normal in this case and the amplifier is allowed to operate normally.

If the controller determines 408 that oscillation is occurring (the status is oscillation) when the signal ratio is below a predetermined value or threshold, then the controller may reduce the gain, turn the amplifier off (or any one of the stages), or the like. Often, the gain is controlled until the effects of oscillation are removed at which point the amplifier may be allowed to resume normal operation. In this context, the signal ratio is continually reevaluated in order to determine when the oscillation has been eliminated or controlled. Monitoring the signal ratio (or the signal ratios) provides an effective means to determine when the amplifier is allowed to resume normal operation.

When determining 406 the status of the amplifier, a certain number of samples within a predetermined amount of time may be averaged. The peak value of the samples can be identified and the average of all the samples can also be determined when the signal ratio is the PAPR. The resulting PAPR is then compared to a threshold or predetermined value to determine the status of the amplifier. The status is oscillation when the PAPR is less than the threshold value and normal when the PAPR is equal to or exceeds the threshold value. Alternatively, an average PAPR that is obtained by averaging the PAPRs associated with multiple windows may also be used in determining the status of the amplifier.

Similarly, other signal ratios can be used to determine the status of the amplifier. The peak to peak power ratio for samples in at least one window or the change in sample power levels in at least one window are also signal ratios that can be used to determine the status of the amplifier as illustrated in FIG. 4.

During operation (or at another time such as evaluation or testing), the gain of the amplifier may be increased to a level above the current operating gain where such an increased level is where oscillation begins. This enables a margin between the operating gain and the oscillation point to be determined. In addition, this may be useful during operation of the device since the amplifier may be able to estimate how much gain can be increased before oscillation occurs in the amplifier. If the margin varies in operation due to actual operating conditions, embodiments of the invention may determine the status of the amplifier independently of using the margin.

The embodiments of the present invention may comprise a special purpose or general-purpose computing device including various computer hardware. The control circuit or other processor included in embodiments of the amplifier are examples of a computing device.

Embodiments within the scope of the present invention also include computer-readable media for carrying or having computer-executable instructions or data structures stored thereon. Such computer-readable media can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. Combinations of the above should also be included within the scope of computer-readable media. Computer-executable instructions comprise, for example, instructions and data which cause a general purpose computer, special purpose computer, or special purpose processing device to perform a certain function or group of functions.

The following discussion is intended to provide a brief, general description of a suitable computing environment in which the invention may be implemented. Although not required, the invention will be described in the general context of computer-executable instructions, such as program modules, being executed by computers in network environments. Generally, program modules include routines, programs, objects, components, data structures, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Those skilled in the art will appreciate that the invention may be practiced in network computing environments with many types of computer system configurations, including personal computers, hand-held devices, multi-processor systems, microprocessor-based or programmable consumer electronics, network PCs, minicomputers, mainframe computers, and the like. The invention may also be practiced in distributed computing environments where tasks are performed by local and remote processing devices that are linked (either by hardwired links, wireless links, or by a combination of hardwired and wireless links) through a communications network. In a distributed computing environment, program modules may be located in both local and remote memory storage devices.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A method for handling parasitic oscillation in an amplifier operating in a wireless network, the method comprising:
   sampling a signal amplified in an amplifier operating in a wireless network a plurality of times to obtain a plurality of samples;
   determining a signal ratio for the signal based on the plurality of samples;
   determining whether a parasitic oscillation is occurring in the amplifier based on the signal ratio; and
   mitigating the parasitic oscillation occurring in the amplifier.

2. The method of claim 1, wherein determining a signal ratio further includes at least one of:
   determining a peak to average power ratio for the signal based on the plurality of samples; and
   determining a peak to peak power ratio for the signal based on the plurality of samples.

3. The method of claim 1, wherein:
   the parasitic oscillation is determined to be occurring in the amplifier when the signal ratio is less than a first predetermined value and the parasitic oscillation is determined to not be occurring in the amplifier when the signal ratio equals or exceeds the first predetermined value.

4. The method of claim 1, wherein mitigating the parasitic oscillation occurring in the amplifier includes adjusting a gain of the amplifier by turning the amplifier off or by reducing the gain gradually or by steps.

5. The method of claim 4, further comprising:
   continuing to monitor the signal ratio for the signal;
   determining that the parasitic oscillation is not occurring in the amplifier based on the signal ratio; and
   increasing the gain of the amplifier when the parasitic oscillation is not occurring in the amplifier.

6. The method of claim 1, further comprising determining a margin between an operating gain and a gain at which parasitic oscillation begins.

7. The method of claim 6, further comprising determining the operating gain based on determining that the parasitic oscillation of the amplifier is not occurring and the margin, wherein the gain of the amplifier is changed by increasing the gain less than the margin or by reducing the gain.

8. The method of claim 1, wherein sampling a signal amplified in the amplifier a plurality of times includes sampling an output of a preamplifier or an output of an amplifier chain.

9. The method of claim 1, wherein determining a signal ratio for the signal based on the plurality of samples comprises applying a window to the plurality of samples, wherein the signal ratio is determined from the samples in the window.

10. The method of claim 9, further comprising determining more than one signal ratio using more than one window, wherein each of the more than one window includes different samples.

11. The method of claim 10, wherein the more than one signal ratio includes a peak to average power ratio and a peak to peak power ratio.

12. The method of claim 1, wherein the plurality of samples are stored in a memory.

13. An amplifier comprising:
   an amplifier chain that receives a signal for amplification;
   a signal detector that samples the signal in the amplifier chain;
   a controller connected with the signal detector, the controller configured:
      to analyze the samples of the signal taken by the signal detector,
      to determine a signal ratio of the signal based on the analyzed samples, and
      to determine whether a parasitic oscillation is occurring in the amplifier chain based on the signal ratio; and
   a switching circuit configured to adjust a gain of the amplifier chain when the parasitic oscillation is determined to be occurring in the amplifier chain by the controller.

14. The amplifier of claim 13, wherein:
   the parasitic oscillation is determined to be occurring in the amplifier when the signal ratio of the samples is less than a first predetermined value and the parasitic oscillation is determined to not be occurring in the amplifier when the signal ratio equals or exceeds the first predetermined value.

15. The amplifier of claim 13, wherein the switching circuit adjusts the gain by adjusting a gain of one or more amplifiers included in the amplifier chain.

16. The amplifier of claim 15, wherein the gain is reduced when the parasitic oscillation is determined to be occurring in amplifier chain.

17. The amplifier of claim 16, wherein the gain is reduced by turning at least one of the one or more amplifiers off or reducing the gain gradually or in steps.

18. The amplifier of claim 13, further comprising a preamplifier to preamplify the signal, wherein an output of the preamplifier is received by the amplifier chain.

19. The amplifier of claim 18, wherein the preamplifier includes a filter configured to pass a particular band of frequencies.

20. The amplifier of claim 13, further comprising a memory for storing the samples, wherein the controller is configured to apply a plurality of windows to the samples to obtain a plurality of signal ratios that include the signal ratio, wherein the parasitic oscillation is determined to be occurring in the amplifier chain based on an average of the plurality of signal ratios being less than a predetermined value.

21. The amplifier of claim 20, wherein the signal ratios include one or more of a peak to average power ratio, a peak to peak power ratio, and a change in sample power levels.

22. The amplifier of claim 13, wherein to determine the signal ratio further includes at least one of:

determining a peak to average power ratio for the signal; and determining a peak to peak power ratio for the signal.

23. The amplifier of claim 22, wherein the controller determines the peak to average power ratio and the peak to peak power ratio by applying a window to the samples, wherein the window includes a certain number of the samples over a certain time period.

24. A method for handling oscillation in an amplifier operating in a wireless network, the method comprising:
- sampling a signal amplified in the amplifier a plurality of times to obtain a plurality of samples;
- determining a signal ratio for the signal based on the plurality of samples by determining one of:
  - a peak to average power ratio based on samples in a window applied to the plurality of samples,
  - a peak to peak power ratio based on the samples in the window,
- determining whether a parasitic oscillation is occurring in the amplifier based on the signal ratio; and
- mitigating the parasitic oscillation occurring in of the amplifier.

* * * * *